United States Patent [19]

Duvall et al.

[11] Patent Number: 4,615,865

[45] Date of Patent: Oct. 7, 1986

[54] OVERLAY COATINGS WITH HIGH YTTRIUM CONTENTS

[75] Inventors: David S. Duvall, Cobalt; Dinesh K. Gupta, Vernon, both of Conn.

[73] Assignee: United Technologies Corporation, Hartford, Conn.

[21] Appl. No.: 512,945

[22] Filed: Jul. 12, 1983

Related U.S. Application Data

[63] Continuation of Ser. No. 289,953, Aug. 5, 1981, abandoned.

[51] Int. Cl.⁴ ............... B32B 15/01; B32B 15/20; C22C 19/03; C22C 30/00
[52] U.S. Cl. .................... 420/588; 420/443; 420/445; 420/455; 420/460; 428/680
[58] Field of Search ............. 420/443, 445, 455, 460, 420/580, 588; 428/678, 680

[56] References Cited

U.S. PATENT DOCUMENTS

| | | | |
|---|---|---|---|
| 3,260,505 | 7/1966 | Snyder | 75/255 X |
| 3,494,709 | 2/1970 | Piearcey | 420/442 X |
| 3,542,530 | 11/1970 | Talboom et al. | 420/583 X |
| 3,676,085 | 7/1972 | Evans et al. | 420/588 X |
| 3,711,337 | 1/1973 | Sullivan et al. | 420/448 X |
| 3,754,903 | 8/1973 | Goward et al. | 420/443 |
| 3,918,139 | 11/1975 | Felten | 428/680 X |
| 3,928,026 | 12/1975 | Hecht et al. | 420/588 X |
| 3,964,877 | 6/1976 | Bessen et al. | 75/171 X |
| 4,005,989 | 2/1977 | Preston | 428/678 X |
| 4,034,142 | 7/1977 | Hecht | 428/678 |
| 4,080,486 | 3/1978 | Walker et al. | 428/678 X |
| 4,116,723 | 9/1978 | Gell et al. | 148/3 |

Primary Examiner—Brian E. Hearn
Assistant Examiner—David A. Hey
Attorney, Agent, or Firm—Charles E. Sohl

[57] ABSTRACT

Improved coating compositions are described for the protection of superalloys at elevated temperatures. The coatings of the NiCrAlY or NiCoCrAlY type are significantly improved by the use of higher levels of yttrium.

1 Claim, 1 Drawing Figure

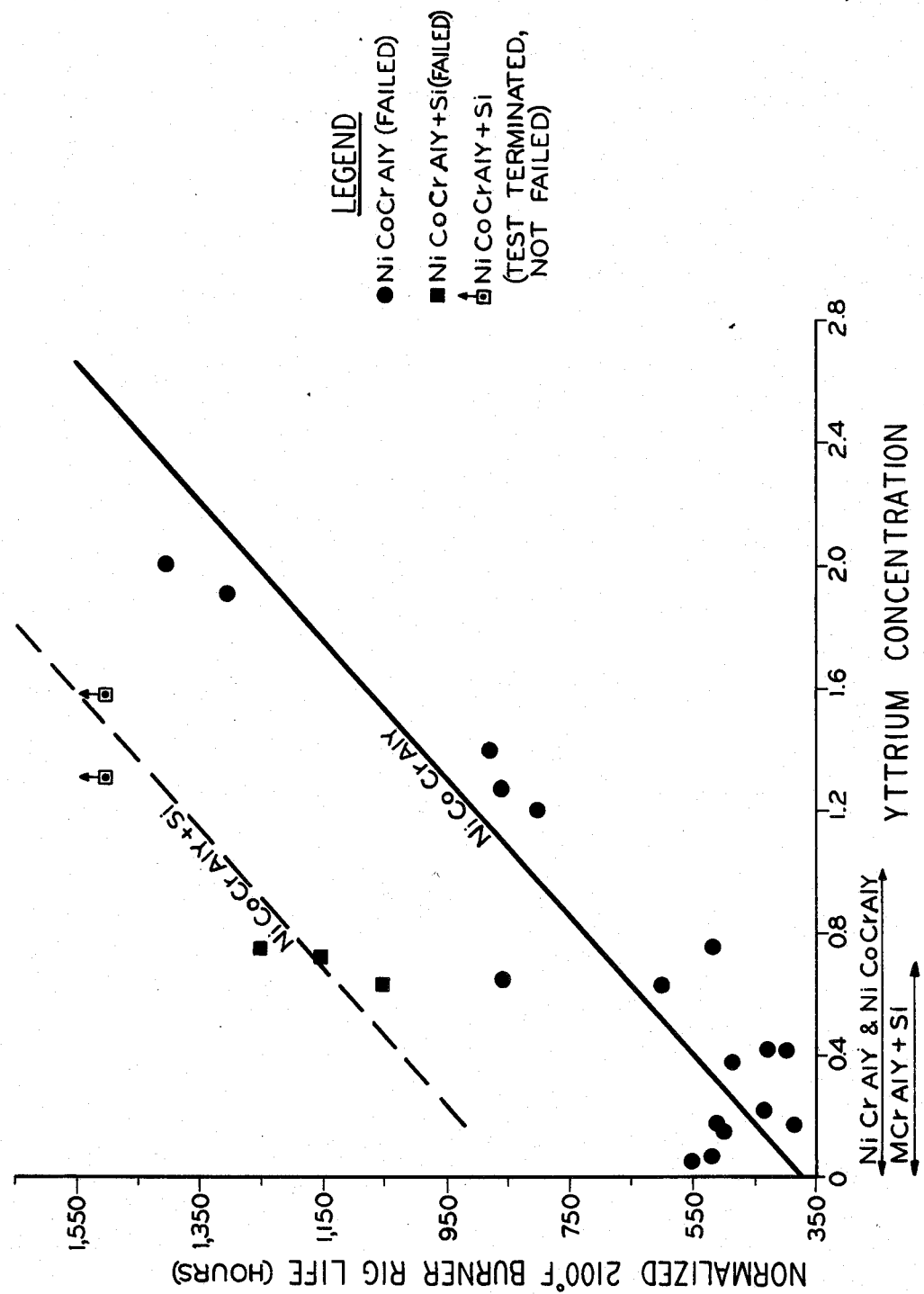

OVERLAY COATINGS WITH HIGH YTTRIUM CONTENTS

This is a continuation of application Ser. No. 06/289,953, filed Aug. 5, 1981, now abandoned.

TECHNICAL FIELD

This invention relates to improved NiCrAlY or NiCoCrAlY coatings which are particularly useful in the circumstance where the coating is applied to a hafnium free superalloy substrate. The essence of the invention is to increase the yttrium level in the coating to a level in excess of that previously used.

BACKGROUND ART

NiCrAlY and NiCoCrAlY type coatings derive their protective capability from their ability to form (and repeatedly reform) a thin layer of alumina on their outer surface. It is this alumina layer which resists oxidation and hot corrosion attack. Oxygen active elements such as yttrium are added to the coatings to promote adherence of the alumina and to retard its tendency to spall. Hafnium can also be added to improve alumina adherence.

The prior art did not anticipate this invention, apparently because of the sequence of developments in the superalloy and coatings field. In the beginning, superalloys were used in the so called equiaxed form and were used either uncoated or coated with the simple coatings such as aluminide coatings. As performance requirements increased, there were parallel improvements in the superalloy and coating areas; in the superalloy area substantial improvements were obtained through the development of directional solidification in which the superalloy is caused to solidify with elongated grains which are crystallographically oriented. This is described in U.S. Pat. No. 3,260,505 which is assigned to the assignee of the present application. In the coating area at about the same time the MCrAlY type overlay coatings were developed. Such coatings are substantially more protective than the previously used aluminide coatings. U.S. Pat. Nos. 3,542,530, 3,676,085, 3,754,903 and 3,928,026 relate to MCrAlY overlay coatings.

Despite the promise of directional solidification, significant problems were encountered in the area of transverse ductility. It was found that the grain boundaries separating the orientated elongated grains were notably weak in the direction transverse to the axis of elongation. This problem was overcome through the addition of small amounts of hafnium to the alloy (0.5-2% Hf) as described in U.S. Pat. No. 3,711,337 which is also assigned to the present assignee.

Because of the development of hafnium modified directional solidified articles and MCrAlY overlay coatings in the same laboratory at about the same time, it was natural that they would be used in combination with each other. It is also natural that highly demanding applications, specifically first stage turbine blades, would involve the use of both hafnium modified directional solidified substrates and MCrAlY overlay coatings.

The MCrAlY coatings were optimized, as to composition, on directionally solidified hafnium containing columnar grain substrates. It was found that yttrium in levels greater than about 0.5 or 0.7 percent by weight produced undesirable low melting point phases at the coating substrate interface, apparently phases based on yttrium and hafnium.

An advancement beyond columnar grain articles is the use of similar but more advanced solidification techniques to produce single crystal articles as described in U.S. Pat. No. 3,494,709. Such single crystal articles are free from internal grain boundaries and hence do not suffer from the transverse ductility problem encountered in the case of columnar grain articles. Consequently, there is no need to add hafnium to tne alloys for ductility improvements and in fact it has been found desirable to eliminate hafnium so as to improve the heat treatability of single crystal superalloy articles. This subject is discussed in U.S. Pat. No. 4,116,723 which is assigned to the present assignee.

The present invention arises from the belated appreciation that the hafnium in the substrate material played a significant role in enhancing coating performance as well as in improving transverse ductility and that the previously developed NiCrAlY and NiCoCrAlY coatings can be significantly improved.

DISCLOSURE OF INVENTION

The coating compositions of the present invention have the following broad composition ranges: 10-35% chromium, 8-20% aluminum, 0-30% chromium, 1.1-3.0% yttrium, balance essentially nickel. Through the use of higher yttrium levels than those previously used in this type of coating, improved oxidation resistant results. The coatings have particular utility on substrates which are free from intentional additions of hafnium.

Other features and advantages will be apparent from the specification and claims and from the accompanying drawings which illustrate an embodiment of the invention.

BRIEF DESCRIPTION OF DRAWINGS

The FIGURE show coating life as a function of yttrium level for two different coatings.

BEST MODE FOR CARRYING OUT THE INVENTION

The basis of this invention is the discovery that under certain circumstances, increasing the amount of yttrium in a NiCoCrAlY coating over that taught in the prior art can be beneficial. The circumstance in which this high yttrium NiCoCrAlY coating is particularly beneficial is when the coating is applied to hafnium free substrates. Table 1 lists composition ranges for the coatings of the present invention.

TABLE 1

|  | Broad | Preferred |
| --- | --- | --- |
| Nickel | Balance | Balance |
| Cobalt | 0-30 | 15-25 |
| Chromium | 10-35 | 15-25 |
| Aluminum | 8-20 | 10-20 |
| Yttrium | 1.1-3.0 | 1.1-3.0 |

These compositions provide enhanced coating oxidation resistance and are similar to the NiCoCrAlY composition described in U.S. Pat. No. 3,928,026 except for the higher yttrium levels. The invention compositions are suited for the protection of nickel base superalloy articles. It is known in the art that under certain circumstances other additions to NiCoCrAlY coatings can be beneficial. For example, U.S. Pat. No. 4,034,142 suggests the addition of silicon to MCrAlY coatings while U.S. Pat. No. 3,918,139 suggests the addition of platinum and similar noble metals to NiCoCrAlY coatings. The present invention can be applied to the modified NiCoCrAlY coatings described in these references. It is also envisioned that tantalum (0–10%) can be added to the high yttrium MCrAlY coatings for improved properties without significantly affecting the beneficial effect supplied by the high yttrium content of the present invention.

The coating compositions previously described may be applied to a variety of substrate types using different application techniques. Various considerations affect the selection of substrate and coating technique and different benefits can result. The greatest benefit results when the high yttrium NiCoCrAlY coatings of the invention are applied to substrates which are free from intentional additions of hafnium. Such substrates may be either of conventionally cast polycrystalline form or directionally solidified columnar grain form, or directionally solidified single crystal form. The columnar grain form is not likely because, to date, hafnium has been found to be necessary to promote adequate transverse grain boundary ductility in columnar grain articles. Nonetheless if one had a hafnium free columnar grain article, the invention coating would be highly protective to it. High yttrium coatings will protect hafninum free substrates independent of coating deposition technique employed.

The FIGURE shows the effect of yttrium content on oxidation life of an NiCoCrAlY coating material as well as a silicon modified NiCoCrAlY coating material. The nominal composition by weight of the NiCoCrAlY material was 22% cobalt, 18% chromium, 12.5% aluminum, varying amounts of yttrium and balance nickel and the nominal composition by weight of the modified silicon NiCoCrAlY composition was 22% cobalt, 18% chromium, 12.5% aluminum, 1.5% silicon, varying amounts of yttrium and balance nickel. All tests were run on a single crystal substrate having a nominal composition of by weight 10% chromium, 5% cobalt, 4% tungsten, 1.4% titanium, 12% tantalum, 5% aluminum balance essentially nickel.

The coatings were applied by electron beam vapor physical deposition process. Testing was performed in a cyclic burner rig operated at a peak temperature of 2100° F. The coating life results were adjusted to reflect differences in coating thickness.

The effect of increased yttrium is seen to be a significant increase in coating life. For example in the Ni- CoCrAlY case, increasing the yttrium content from 1% to 2% increases the coating life from about 825 hours to about 1290 hours, an increase of more than 50%.

Another class of substrates to which the invention coating can be applied are those substrates which contain hafnium. If the invention coatings are applied to substrates which contain hafnium, the formation of low melting phases at the substrate-coating interface may be a problem. This can be minimized if the coating is applied by a plasma spray process. Plasma spray deposited coatings invariably contain a sufficient quantity of oxygen to oxidize the substrate hafnium which is near the coating-substrate interface Once the hafnium is oxidized, it is stable and will not form the deleterious low melting point phase. Thus the deposition of the invention coatings by plasma spraying onto hafnium containing substrates does not present melting point problems.

When MCrAlY coatings are applied by vapor deposition to hafnium containing substrates, hafnium from the substrate diffuses into the coating and improves its performance. However, when MCrAlY coatings are applied by plasma spraying to hafnium containing substrates, the oxygen which is present as yttrium and aluminum oxides in the coating prevents the hafnium from diffusing sufficiently to the surface of the coating to improve its performance. Instead, the diffusing hafnium reduces the other oxides, (alumina and yttria) and forms stable hafnium oxides, and as a result, no coating improvement results.

By using the yttrium-rich coating of the present invention, it is possible to compensate for the loss of the substrate hafnium "effect" on plasma sprayed coatings. The increased yttrium substitutes for the missing hafnium in promoting good adherence of the coatings' protective alumina scale. Thus plasma spray coating durability is enhanced even on hafnium-containing substrates.

It should be understood that the invention is not limited to the particular embodiments shown and described herein, but that various changes and modifications may be made without departing from the spirit and scope of this novel concept as defined by the following claims.

We claim:

1. A coating gas turbine component displaying enhanced resistance to oxidation which comprises a superalloy substrate, said superalloy containing 0.1–2% Hf, and a plasma sprayed coating on the substrate, said coating consisting essentially of 10–35% Cr, 8–20% Al, 1.1–3.0% Y, 0–30% Co, balance nickel.

* * * * *

UNITED STATES PATENT AND TRADEMARK OFFICE
CERTIFICATE OF CORRECTION

PATENT NO. : 4,615,865

DATED : October 7, 1986

INVENTOR(S) : David S. Duvall et al

It is certified that error appears in the above-identified patent and that said Letters Patent is hereby corrected as shown below:

Column 4, line 44:   After "A" change "coating" to --coated--

Signed and Sealed this

Tenth Day of March, 1987

Attest:

DONALD J. QUIGG

Attesting Officer

Commissioner of Patents and Trademarks